United States Patent [19]

Pathak et al.

[11] Patent Number: 4,851,720
[45] Date of Patent: Jul. 25, 1989

[54] LOW POWER SENSE AMPLIFIER FOR PROGRAMMABLE LOGIC DEVICE

[75] Inventors: Jagdish Pathak, Los Altos Hills; Stephen M. Douglas, Santa Clara, both of Calif.; Hal Kurkowski, Dallas, Tex.; Dov-Ami Vider, Sunnyvale, Calif.

[73] Assignee: Cypress Semiconductor Corporation, San Jose, Calif.

[21] Appl. No.: 240,089

[22] Filed: Sep. 2, 1988

[51] Int. Cl.[4] .................. G11C 7/02; H03K 17/284; H03K 17/22; H03K 17/26

[52] U.S. Cl. .................................. 307/530; 307/603; 307/594; 307/468; 365/196; 365/208

[58] Field of Search ............... 307/530, 354, 270, 571, 307/581, 584, 482, 468, 362, 591, 592, 594, 595, 596, 603, 605; 365/103, 104, 195, 196, 208; 364/716

[56] References Cited

U.S. PATENT DOCUMENTS

| | | | |
|---|---|---|---|
| 4,124,899 | 11/1978 | Bickner et al. | 307/465 |
| 4,439,697 | 3/1984 | Suzuki et al. | 307/530 |
| 4,570,091 | 2/1986 | Yasuda et al. | 307/530 X |
| 4,599,525 | 7/1986 | Tzeng | 307/530 X |
| 4,604,732 | 8/1986 | Van Tran | 307/530 X |
| 4,609,986 | 9/1986 | Hartmann et al. | 364/716 X |
| 4,617,479 | 10/1986 | Hartmann et al. | 307/468 X |
| 4,658,158 | 4/1987 | Chau et al. | 307/530 |
| 4,739,198 | 4/1988 | Maruyama | 307/530 |
| 4,774,690 | 9/1988 | Watanabe et al. | 307/530 X |
| 4,805,150 | 2/1989 | Asano et al. | 307/530 X |

*Primary Examiner*—Stanley D. Miller
*Assistant Examiner*—David R. Bertelson
*Attorney, Agent, or Firm*—Blakely, Sokoloff, Taylor & Zafman and Roger S. Borovoy

[57] ABSTRACT

The invention pertains to a circuit for controlling the power to a plurality of sense amplifiers used for sensing data on data lines in an array of floating gate storage cells, wherein the data stored in the array is sensed at regular intervals. The circuit includes a first plurality of data paths through the array, and a second data path containing replications of all necessary circuit elements in the first plurality of data paths to assure that the data delay through the second path equals or exceeds the maximum delay in any of the first plurality of data paths. A clock is used to provide an initiation signal which starts the propagation of input data through the array. A means is coupled to the clock for sending a dummy data pulse through the second data path upon receipt of the initiation signal, and a detecting means detects the completion of the passage of the dummy data through the second path and supplies a completion signal in response. A switch coupled to the clock, the sense amplifiers and the detecting means powers up the sense amplifiers upon receipt of the initiation signal from the clock, and powers down the sense amplifiers upon receipt of the completion signal from the detecting means. The control circuit of the invention reduces the power consumption of the sense amplifiers because they are powered only during the duration of data transmission, but are otherwise powered down.

21 Claims, 5 Drawing Sheets

LOW POWER SENSE AMPLIFIER FOR PROGRAMMABLE LOGIC DEVICE

BACKGROUND OF THE INVENTION

This invention relates to an improved, low power sense amplifier for a programmable logic device (PLD) which utilizes an electrically programmable, read-only memory (EPROM) as the storage cell at each "intersection" of the array.

Programmable logic devices using EPROM storage cells are well known. Their operation and structure have been described in the literature and in patents. For example, U.S. Pat. Nos. 4,124,899; 4,609,986 and 4,617,479 and the references cited in those patents describe such arrays. Further information is contained on pages 4-1 through 4-61 of *CMOS Data Book* of Cypress Semiconductor Corporation, 3901 N. First Street, San Jose, Calif. 95134.

Recent advances in sensing techniques for PLDs include the use of a reference voltage generator and clamp to reduce the voltage swings on the product term lines. Using such a reference voltage generator and clamp, when the PLD circuit is powered up, the voltage at the output of the reference voltage generator, connected to the product term line, converges near the trip paint of the sense amplifier rather than near the rail voltage of the CMOS devices. This reduces the amount by which the product term line must be pulled during sensing. However, since the reference voltage generator maintains the product term line at a higher voltage than where it would otherwise be, the circuit requires more DC power.

Because of the added power requirements of these advanced sense amplifiers, a need arises for new techniques to reduce power consumption. The sense amplifiers draw 70 to 80 percent of the power used in a PLD. The circuit of this invention provides a sense amplifier with substantially reduced power consumption.

SUMMARY OF THE INVENTION

The control circuit of this invention is used to control the power to a plurality of sense amplifiers used for sensing data on data lines of a PLD which employs EPROMs or E$^2$PROMs for data storage. The circuit is applicable to arrays which are sensed at regular intervals, e.g., clock-controlled.

The circuit of the invention includes a first plurality of data paths through the array. These are the data paths normally used as programmable circuit functions within the array. A second data path in the array of this invention contains replications of all necessary circuit elements in the first plurality of data paths so as to insure that the data delay through this second path equals or exceeds the maximum delay in any of the first plurality of data paths.

A clock provides an initiation signal which starts the propagation of input data through the array. A means, such as a register, is coupled to the clock and sends a dummy data pulse through the second, dummy data path upon receipt of the initiation signal from the clock. A detecting means detects the completion of the passage of the dummy data pulse through the second path and supplies a completion signal in response to such completion. Finally, a switch coupled to the clock, the sense amplifiers, and the detecting means is employed for powering up the sense amplifiers upon receipt of the initiation signal from the clock, and for powering down the sense amplifiers upon receipt of the completion signal from the detecting means.

The circuit of this invention reduces the power consumption of the sense amplifiers in the array because they are powered only during data transmission, but are otherwise powered down.

In a preferred embodiment of the invention, the second data path contains at least on EPROM cell having delay characteristics equivalent to the worst case delay characteristics in the EPROM cells of the array, and a dummy sense amplifier which is always powered. The EPROM cell (or cells) in the dummy path are unprogrammed.

The invention and certain preferred embodiments will be described with reference to particular circuits, voltages, signals and other details helpful for a thorough understanding of the invention. It will be understood by those skilled in the art that the invention may be practiced without using the specific details described and shown in the drawings, and that alternatives may be used without departing from the spirit and scope of the invention.

DESCRIPTION OF THE INVENTION

Figure 1:
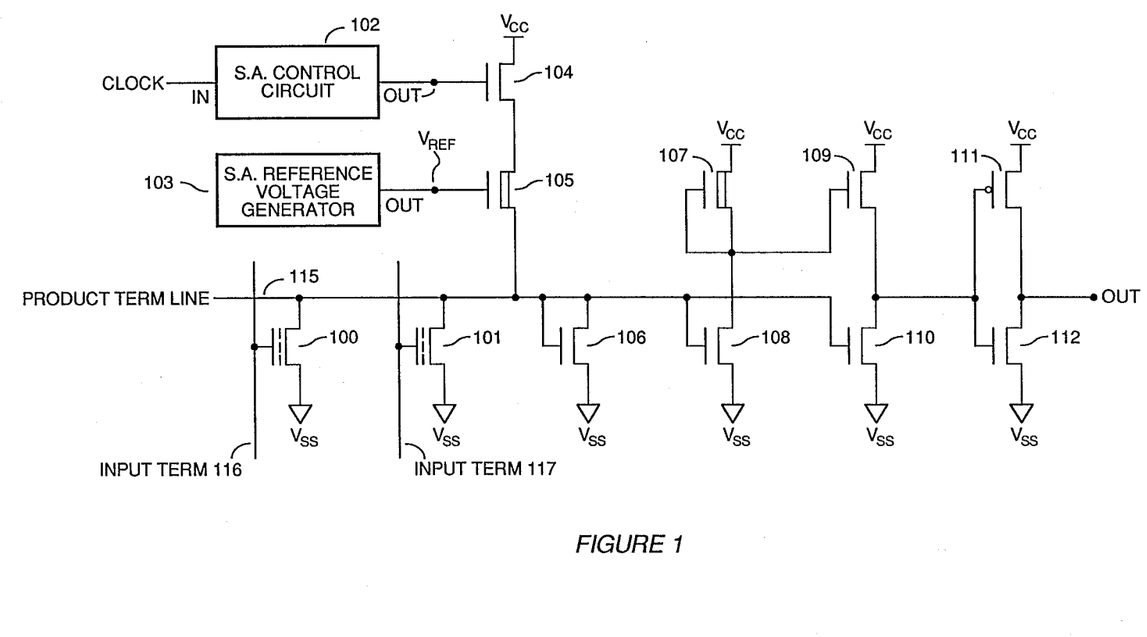
FIG. 1 is a circuit schematic which shows how the control circuit of the invention is used in a PLD.

Referring to FIG. 1, the essential elements of the PLD of the invention are illustrated. In this array, stored data is sensed at regular intervals. Input data is normally contained on input registers, one register for each bit of binary data. The registers themselves are well known and thus are not illustrated. The outputs of these registers containing the input data are connected to input term lines 116 and 117 shown in FIG. 1. A different register output is connected to each input term line.

The PLD is programmed, as is well known, by the presence or absence of stored charge on the floating gate of the EPROMs, illustrated by EPROMs 100 and 101. As is well known, these same concepts can be used with E$^2$PROMs. For the purpose of this invention, E$^2$PROMs, which are electrically erasable, are considered an EPROM since both EPROMs and E$^2$PROMs are electrically programmable, and most E$^2$PROMs are also floating gate. Using CMOS technology, where input term 116 is to be used by the programmed logic of the array, there will be an absence of charge on the floating gate of EPROM 100. Conversely, if input term 116 were not to be used, charge would be stored on EPROM 100. Similarly, if input term 117 were to be used, charge would be absent from the floating gate of EPROM 101. Obviously these two EPROMs are merely illustrative, and typically as many as 66 or more EPROMs may be used for a single product term on term line 115. Similarly, product term line 115 shown in FIG. 1 is merely illustrative of the many product terms in the PLD. Depending on the programming pattern of the EPROMs of a single product term line, such as line 115, the input terms to the EPROMs on line 115 from the registers will cause either a high or a low state on product term line 115, indicating the product.

MOS device 104, illustrated as an N-channel, enhancement mode MOS device, acts as a switch to turn power on and off to the sense amplifier of the invention, which includes reference voltage generator 103, depletion mode, N-channel MOS transistor 105, depletion mode N-channel MOS transistor 107, enhancement mode N-channel transistors 106, 108, 109, 110 and 112, and enhancement mode P-channel transistor 111. Switching transistor 104 is controlled by control circuit 102, as will be described in more detail later with reference to FIG. 2. Reference voltage generator 103 will also be described in more detail later in connection with FIG. 4.

The description of the operation of the sense amplifier of FIG. 1 which follows assumes that switch 104 is turned on so that the amplifier is powered. Depletion mode transistor 105 is used as a pull-up transistor, as is well known in the art. However, the current through pull-up transistor 105 is set by voltage reference generator 103, as will be described later. Transistor 104 remains on during sensing. Transistor 105 remains on all the time. When transistor 104 turns off, transistor 106 pulls product term line 115 low, causing the output "OUT" of the sense amplifier to be low.

Transistor 106 is used as a product term clamp. Transistor 106, having its gate and drain connected to term line 115 and its source connected to ground, prevents the voltage on term line 117 from swinging fully to the positive power supply $V_{cc}$. Thus it acts as a clamp to maintain product term line 115 near the threshold voltage of enhancement mode N-channel transistor 106 when no EPROM cells are conducting. This clamping action reduces the swing of product term line 115 towards $V_{cc}$. As is well known, this speeds the switching of product term line 115.

N-channel depletion-mode transistor 107, together with N-channel enhancement mode transistor 108, serves as a depletion load inverter for the sense amplifier. This inverter inverts and amplifies the signal on product term line 115. It is necessary to invert the signal on product term line 115 before it passes to the next stage (comprising N-channel enhancement mode transistors 109 and 110) which serves as a level shifter. The entire sense amplifier of the illustrated embodiment is non-inverting.

The amplification stage comprising transistors 107, 108, 109 and 110 provides both amplification of the voltage on product term line 115 as well as its inversion. For example, if the voltage going into the level shifter (transistors 109 and 110) at the gate of transistor 110 were in the range of about one volt which corresponds to a logic 0 on the product term line 115, the output voltage from the level shifter is amplified and inverted to bring it closer to $V_{cc}$. If, for example, $V_{cc}$ is five volts, the voltage at the output of the level shifter at the gates of transistors 111 and 112 may be in neighborhood of 3.5 volts. It is desirable to have this output voltage, prior to the final stage, as close as possible to a full CMOS rail output specified by $V_{cc}$.

The final stage of amplification, employing MOS transistors 111 and 112, creates the full CMOS rail voltage at the output "OUT", and reinverts the signal to the correct polarity which matches the original polarity of the product term on line 115. However, both inverting and non-inverting amplifiers may be employed in the invention as desired.

Figure 2:
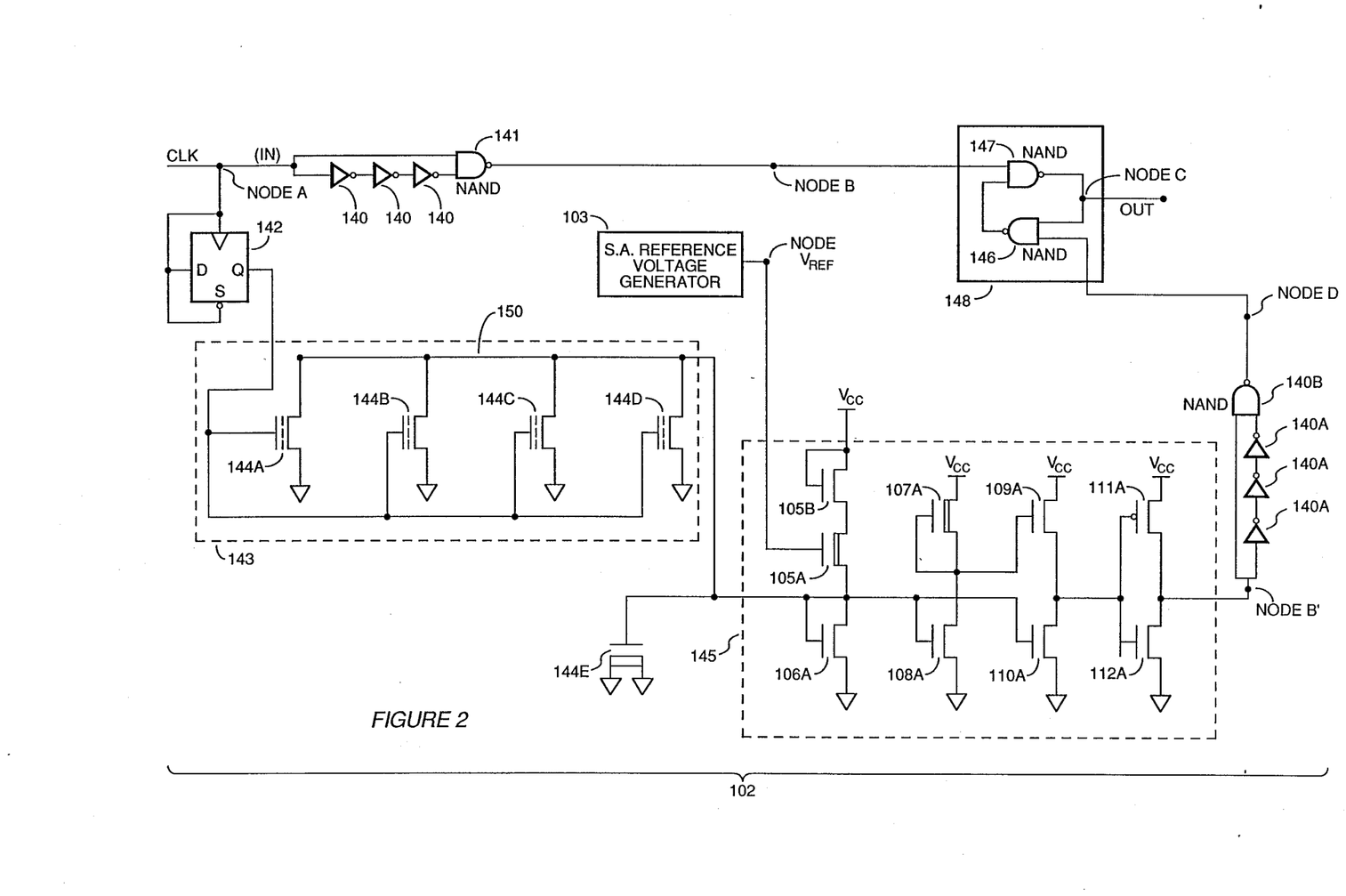
FIG. 2 is a circuit schematic of the control circuit of the invention.

The circuit for controlling the power to the sense amplifiers of the array of this invention is shown in FIG. 2. The operation of the circuit is controlled by a clock at node A. For example, the clock pulse at node A can be a low-to-high transition. The plurality of inverters 140, of which there are three in the illustrated example, establish the pulse width of the "set" pulse to be generated by NAND GATE 141 for flip-flop 148. An odd number of inverters 140 is required so that immediate triggering at the output of NAND GATE 14 is achieved, taking into consideration the one gate delay through the NAND GATE itself. Obviously this is true for a clock having a rising edge. If the clock input at node A had a falling edge, however, resulting from a high to low transition, a NOR GATE would have to be employed in place of NAND GATE 141.

Inverters 140 and NAND GATE 141 together generate the set pulse to flip-flop 148, which is made up of two NAND GATES 146 and 147. The circuit is designed so that the set pulse to flip flop 148 has a predetermined width and transition time. The output of flip flop 148 at node C provides the signal to power up the sense amplifiers. This signal passes to the gate of MOS transistor 104, shown in FIG. 1. Obviously, in a complete PLD, there are multiple sense amplifiers, for example, 258 in the Cypress CY7C330 PLD, one for each product term line. However, only a single control circuit of the type shown in FIG. 2 is required for the entire PLD. Node C is thus connected to the equivalent of transistor 104 in each of the sense amplifiers on each of the product term lines.

Upon receipt of a rising clock pulse at note A, NAND GATE 141 produces a set pulse to flip flop 148, causing node C at the output of flip flop 148 to have a low-to-high transition, which is the proper signal to turn on transistors 104 (shown in FIG. 1) of each of the sense amplifiers of the PLD.

At the same time, this same low-to-high clock pulse at node A initiates the passage of a signal through a second, or "dummy" data path, containing replications of all necessary circuit elements in the data paths of the array to assure that the data delay through the dummy path equals or exceeds the maximum delay through any of the data paths in the principal array. The initiation clock pulse first goes to the clock input of dummy input register 142. At its "Q" output, register 142 provides a high-to-low transition pulse into the input of dummy array 143. Later, on the falling edge of the clock pulse, the high-to-low edge of the pulse at the "S" input sets register 142, generating a low-to-high transition on the "Q" output.

Dummy array 143 is an array of EPROM cells 144A, B, C and D. Care should be taken so that these EPROM cells are typical of the EPROM cells used in the remainder of the PLD. For example, one should be sure that the dummy EPROMs are not located on the edge of the array where they may be subject to more process variations than EPROM cells located more centrally. For example, in a 3×3 matrix of EPROM cells, the center cell can be used as the dummy cell. The object is to be sure that worst case time delays occur through the dummy cells as opposed to through the EPROM cells of the principal array. Another useful precaution to insure that the dummy cells have the longest delays is to lay them out in the same topological orientation as the EPROM cells of the principal array in case the process turns out to be orientation-sensitive. Similarly, in laying out dummy sense amplifier 145, matching of orientation to the principal sense amplifiers is helpful since sense amplifiers use very small voltage swings and thus may be more topology-sensitive.

It is important that the dummy EPROMs 144A, B, C and D, as well as the dummy EPROM 125 in the reference voltage generator 103, are not programmed. If the cells in the array were programmed, they would never conduct current and it would not be possible to pass the dummy pulse through the dummy path. If dummy EPROM 125 in the reference voltage generator 103 were programmed, an invalid voltage would appear at the output node.

To more fully replicate the capacitance of the input term line (which in some cases may consist of 258 product terms), it has been found advantageous to add an additional depletion mode, N-channel MOS transistor 144E. This transistor has its gate connected to the drains of the dummy EPROM cells 144A, B, C and D. The source and drain of depletion mode transistor 144E are connected to ground. A depletion mode device is used because it provides a constant capacitance, thus insuring that the capacitance on line 150 is equal to or greater than the capacitance on the input term lines of the principal array. However, if the dummy EPROMs are located as suggested above, within the principal EPROM array, the parasitic capacitance of the input lines and the product lines are often sufficient to provide the requisite delay without using an added device such as device 144E.

In another embodiment of the invention, a single EPROM was employed instead of the plurality of EPROMs 144A, B, C and D as illustrated in FIG. 2. It has been possible to use a single EPROM rather than multiple ones if care is taken so that such EPROM represents a worst case EPROM of the array. It has been found that the longest pulse transitions (delays) occur where a single EPROM is being pulled from high to low, or where the maximum number of EPROMs on any term line simultaneously are released from low to high. If the sense amplifier were designed, as is known in the art, so that the delay of a term line with the maximum number of EPROMs releasing is no greater than the delay of a single EPROM being pulled from high to low, a single EPROM can be used in the dummy array 143. In that case, again particular care should be used in selecting the orientation and topology of the dummy EPROM to insure that its delay in being pulled from high to low is no less than that of any of the other EPROMS in the principal array of the PLD.

It is also important to take care in choosing input clock polarities, a clock having a rising edge (low-to-high) being preferred. For the single EPROM embodiment, register 142 shown in FIG. 2 must generate an output transition of the opposite polarity from that shown. To accomplish this, the clock should be connected through an inverter to the "D" input of register 142, and also to the "Reset", rather than the "Set" input as shown.

Register 142 forces the voltage level at the input to the dummy array to be low prior to the receipt of a clock pulse, and high afterwards, insuring a rising edge.

The rising pulse edge from register 142 insures a high-to-low transition on the dummy product term in dummy array 143, the high-to-low transition being selected as the worst case transition. Obviously if design considerations indicated the opposite to be the case, all the polarities can be reversed. The key is to make sure that the dummy array mimics the worst case transition, whether that be a high-to-low or low-to-high transition.

The output from the dummy array passes to dummy sense amplifier 145. Transistor 105$b$ has its gate connected to $V_{cc}$, insuring that it is always on. It is essential that this sense amplifier in the dummy path does not turn itself off, or obviously the control apparatus of the invention would be inoperative. Since there is only a single control for an entire array of sense amplifiers, the additional power used in maintaining the dummy sense amplifier 145 on all the time is negligible.

In the dummy array, the drains of EPROMs 144A, B, C and D are connected to the output line 150 to sense amplifier 145. The sources are connected to $V_{ss}$, or ground. The dummy pulse through array 143 and dummy sense amplifier 145 mimics what the actual data does going through the array. The dummy sense amplifier 145 uses a very small voltage on its input line 150, for example a few hundred millivolts, and amplifies this level to the full CMOS rail voltage, for example 5 volts, at node B'. The illustrated sense amplifier does not invert the input signal from line 150 and thus produces a signal of the same polarity at output node B'.

In the illustrated embodiment, the signal at output node B' is a low-to-high transition, which triggers the reset pulse to be generated by NAND GATE 140B. The chain of inverters 140A determines the width of the reset pulse. This provides a high-to-low-to-high output pulse at node D, exactly as was described at node B through inverters 140 and NAND GATE 141. The pulse from node D into flip flop 148 generates a high-to-low transition on output node C from flip-flop 148, which passes to the gates of the input transistors 104 (shown in FIG. 1) of all the sense amplifiers. The operation of dummy sense amplifier 145, except for the fact that it is always powered on, is exactly the same as the operation of the sense amplifier comprising transistors 104, 105, 106, 107, 108, 109, 110, 111 and 112, described in connection with FIG. 1.

Figure 3:
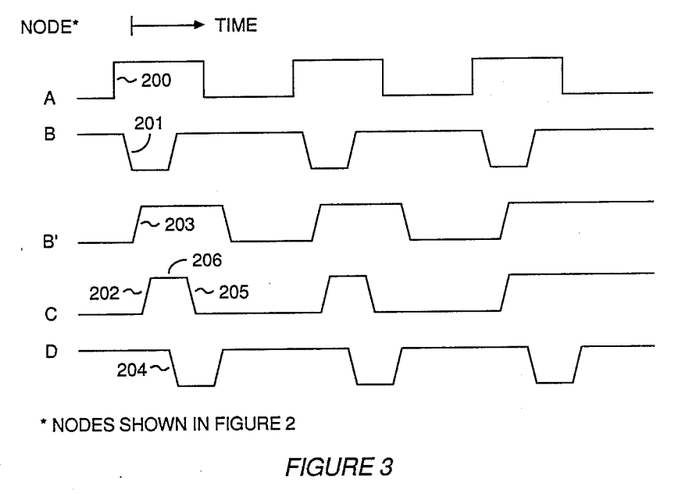
FIG. 3 is a timing description of the pulses and signals employed in connection with the circuit of FIG. 2.

The timing of the pulses on the control circuit of FIG. 2 can best be understood by reference to the timing diagrams in FIG. 3. The pulses and delays are exaggerated for ease of understanding. Referring now both to FIGS. 2 and 3, the low-to-high transition 200 at node A from the clock initiates the cycle of operation of the control circuit of the invention. This triggers a high-to-low transition 201 at node B which sets flip-flop 148, producing transition 202 at node C which powers up the sense amplifiers of the array for the entire duration of pulse 206.

Meanwhile, the rising edge 200 of the input clock pulse at node A passes through register 142, dummy array 143 and dummy sense amplifier 145 to output node B'. These additional circuit elements intentionally delay the pulse from node A at least long enough to assure that the real pulses have passed through the principal array and output signals have been generated from their respective sense amplifiers. This delay is reflected by the difference in time between the low-to-high transition 200 at node A and low-to-high transition 203 at node B'. The low-to-high transition 203 at node B' triggers the high-to-low transition 204 at node D. This delayed transition 204 at node D triggers the right high-to-low transition 205 at node C, which is the output of flip-flop 148.

Accordingly, the delay between low-to-high transition 200 at node A and low-to-high transition 203 at node B' is equal to the delay between the low-to-high transition 202 at node C and the high-to-low transition 205 also at node C. Thus the pulse width of pulse 206 represents the delay time through the dummy path. Following the delay of the input clock pulse through the dummy path, the high-to-low transition 204 at node D resets flip-flop 148, turning off power to the sense amplifiers. High-to-low transition 205 at node C, at the gate of transistors 104 (shown in FIG. 1), accomplishes this turn off.

Figure 4:
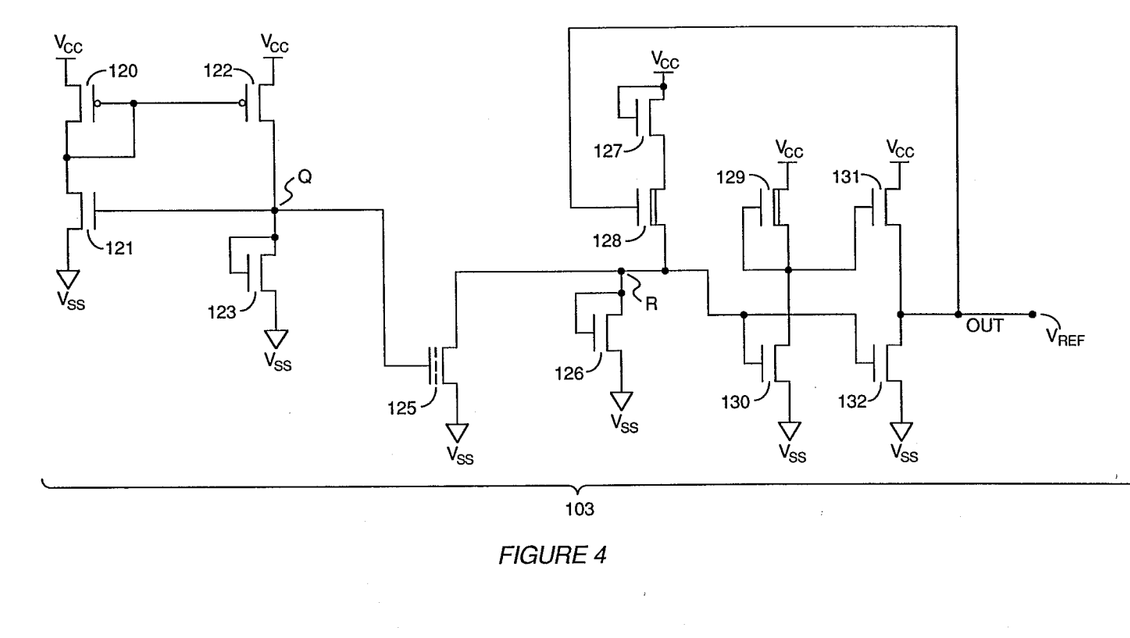
FIG. 4 is a schematic circuit diagram of the reference voltage generator 103, shown as a block in FIG. 2.

Reference voltage generator 103 shown in FIG. 2 is shown in more detail in FIG. 4. Referring to FIG. 4, P-channel transistors 120 and 122 and N-channel transistors 121 and 123 together comprise a temperature compensation current source. This current source compensates the voltage at output node Q with variations in temperature. The output of the temperature compensation circuit at node Q is connected to the gate of dummy EPROM 125. The source of this EPROM is connected to $V_{ss}$ and its drain is connected to a sense amplifier, the input of which at node R is coupled between the drain of N-channel enhancement mode MOS transistor 126 and the source of N-channel depletion mode transistor 128. This sense amplifier, like the sense amplifier in the dummy path, is always on, therefore the gate of transistor 127 is coupled to $V_{cc}$, as shown.

The sense amplifier in this reference voltage generator 103 is similar to the sense amplifiers of the array and of the dummy path, but does not employ the full CMOS last amplification stage. Accordingly, this sense amplifier has an inverting output labeled "OUT". Moreover, the signal from this inverting output is fed back to the gate of N-channel depletion mode transistor 128, as shown, to provide negative feedback. Otherwise, the operation of this sense amplifier is exactly as explained for sense amplifier 145 in FIG. 2, transistor 126 being analogous to transistor 106A, transistors 129 and 130 being analogous to transistors 107A and 108A, respectively, and transistors 131 and 132 being analogous to transistors 109A and 110A. This sense amplifier in the reference voltage generator is designed so that when the circuit is powered up, the voltage at the output node "OUT" will converge near the trip point of the sense amplifiers used in the PLD itself. This allows the product term lines to sit close to the sense amplifier's trip point so that they do not have to be pulled so far during sensing. As is well known, this speeds the operation of the array.

Reference voltage generator 103 allows the sense amplifiers in the PLD of the invention to track the EPROM cell current. It makes the trip point of the sense amplifier a variable function of the EPROM cell current, thus compensating for any process variations of the EPROMs. The cell currents of the EPROM of the array are mimicked by the cell current of EPROM 125 in the sense amplifier of FIG. 4. If the EPROM of the array (and dummy EPROM 125) were slightly slower because of process variations, then this sense amplifier without the reference generator would be slower because it takes longer to trip the sense amplifier from high-to-low or low-to-high to provide an output signal. The use of this reference voltage generator including a dummy EPROM makes the sense amplifiers of the PLD much more process independent.

Figure 5:
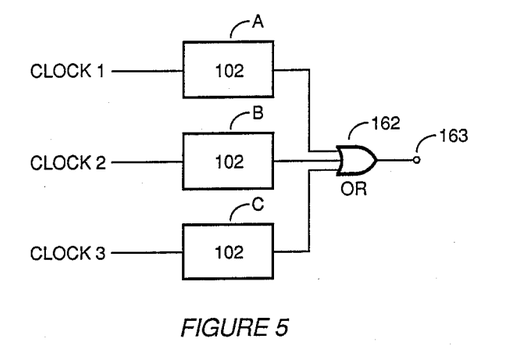
FIG. 5 is a schematic circuit diagram of a preferred embodiment of the invention employing multiple clocks.

Referring to Figure 5, another embodiment of the invention is shown using multiple clocks. Each of the clocks has its own sense amplifier control circuit 102 of the type shown in FIG. 2. These control circuits operate exactly as described above. Each clock may, for example, control different functions within the PLD. For example, clocks 1 and 2 through circuits A and B, respectively, can clock different sets of input data where one set of data needs to be clocked at a rate different from another. The third clock is sometimes used to clock the output register of the PLD. Since output registers are commonly fed back through the array to input terms, the sense amplifiers of the PLD must be turned on during this feedback process in order to make the calculations of these input terms, which includes the data which is fed back.

It is essential, therefore, that the sense amplifiers in the PLD of the invention be turned on, using the control circuits 102 A, B and C if any data is being clocked by any one of these three clocks. Accordingly, the outputs of circuits A, B and C are all fed through OR-gate 162 to output 163. Each control circuit A, B or C can therefore independently generate power up and power down signals for all the sense amplifiers in the array, as described earlier, upon the presence of a pulse from its corresponding clock 1, 2 or 3. Even if two of these clocks overlap, the pulse emerging from OR-gate 162 will keep the sense amplifiers on until the latter of the two clock signals emerges through the dummy path to generate a completion signal.

Figure 6:
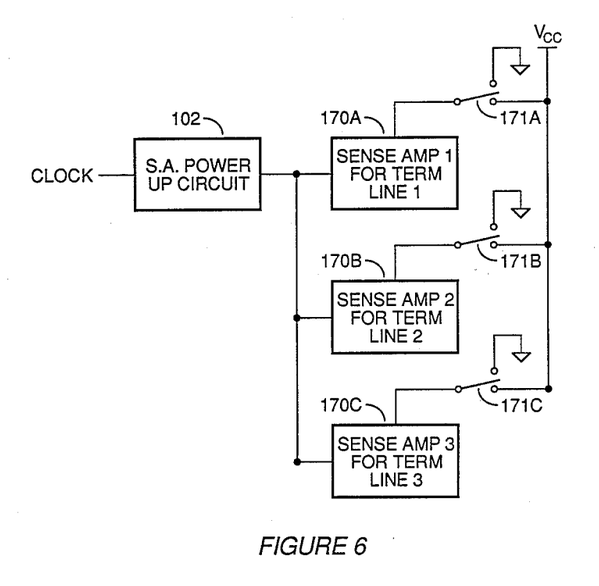
FIG. 6 is a block diagram of a preferred embodiment of the invention employing additional switches on the sense amplifiers.

Another power saving feature of the invention is the use of a more permanent switching technique shown in FIG. 6. In this embodiment, the sense amplifiers 170A, B, and C of each term line may be switched off by its respective switch 171A, B, or C. In most PLD applications, the array is programmed so that some product terms are never used. Using this feature of the invention, the power to the sense amplifiers for unused product term lines may be switched off during this programming step. Switches 171A, B and C in practice are normally EPROMs. They are opened or closed, as is well known in the art, by the presence or absence of charge on their floating gates, depending on the polarities of the other circuit elements and the type of EPROMs employed. These switches may be automatically opened, disconnecting their respective sense amplifier, as shown in FIG. 6, when the initial programming codes are sent to the PLD indicating that the associated product term for that sense amplifier is not to be employed during the operation of the array.

We claim:

1. A circuit for controlling the power to plurality of sense amplifiers used for sensing data on data lines in an array of floating gate storage cells, wherein data stored in said array is sensed at regular intervals, comprising:
   a first plurality of data paths through said array;
   a second data path containing replications of all necessary circuit elements in said first plurality of data paths to assure that the data delay through said second path equals or exceeds the maximum delay in any of said first plurality of data paths;
   clock means for providing an initiation signal which starts the propagation of input data through said array;

means coupled to said clock means for sending a dummy data pulse through said second data path upon the receipt of said initiation signal;

detecting means for detecting the completion of the passage of said dummy data pulse through said second data path and for supplying a completion signal in response thereto; and switching means coupled to said clock means, said sense amplifiers and said detecting means for powering up said sense amplifiers upon receipt of said initiation signal from said clock means, and for powering down said sense amplifiers upon receipt of said completion signal from said detecting means, whereby the power consumption of said sense amplifiers is reduced because they are powered only during the duration of data transmission, but are otherwise powered down.

2. The circuit of claim 1 further characterized by said second data path containing a floating gate storage element.

3. The circuit of claim 2 further characterized by said floating gate storage element being unprogrammed.

4. The circuit of claim 2 further characterized by said floating gate storage element being selected as the slowest switching storage element in the array.

5. The circuit of claim 1 further characterized by said second data path including a sense amplifier connected so that it is always powered.

6. The circuit of claim 5 further characterized by said second data path also containing a floating gate storage element.

7. The circuit of claim 1 further characterized by said second data path containing a plurality of floating gate storage elements.

8. The circuit of claim 7 further characterized by said floating gate storage elements being unprogrammed.

9. The circuit of claim 6 further characterized by said second data path also containing a depletion mode MOS transistor having its gate connected in the circuit and its source and drain grounded.

10. A circuit for controlling the power to plurality of sense amplifiers used for sensing data on data lines in an array of floating gate storage cells, wherein data stored in said array is sensed at regular intervals, comprising:

a first plurality of data paths through said array;

a plurality of clock means, each clock means providing an initiation signal which starts the propagation of certain data through said array and through the respective one of said first plurality of data paths associated with said clock means;

a second plurality of data paths, one for each of said clock means, containing replications of all necessary circuit elements in said first plurality of data paths to assure that the data delay through said second path equals or exceeds the maximum delay in any of said first plurality of data paths;

means coupled to each of said plurality of clock means for sending a dummy data pulse through the respective one of said second plurality of data paths associated with said clock means upon the receipt of said initiation signal;

a plurality of detecting means, one for each of said second data paths, for detecting the completion of the passage of said dummy data pulse through its respective one of said second data paths and for supplying a completion signal in response thereto OR-gate means for OR-ing said initiation and said completion signals; and switching means coupled to said sense amplifiers and to said OR-gate means for powering up said sense amplifiers upon receipt of an initiation signal from said OR-gate means and for powering down said sense amplifiers upon receipt of a completion signal from said OR-gate means, whereby the power consumption of said sense amplifiers are reduced because they are powered only during the duration of data transmission, but are otherwise powered down.

11. The circuit of claim 10 further characterized by each of said second plurality of data paths containing a floating gate storage element.

12. The circuit of claim 11 further characterized by each of said floating gate storage elements being unprogrammed.

13. The circuit of claim 11 further characterized by each of said floating gate storage elements being selected as the slowest switching storage element in the array.

14. The circuit of claim 10 further characterized by each of said second data paths including a sense amplifier connected so that it is always powered.

15. The circuit of claim 14 further characterized by each of said second data paths also containing a floating gate storage element.

16. The circuit of claim 10 further characterized by each of said second data paths containing a plurality of floating gate storage elements.

17. The circuit of claim 16 further characterized by each of said floating gate storage elements being unprogrammed.

18. The circuit of claim 15 further characterized by each of said second data paths also containing a depletion mode MOS transistor having its gate connected in the circuit and its source and drain grounded.

19. A circuit for controlling the power to a plurality of sense amplifiers used for sensing data on data lines in an array of floating gate storage cells, comprising:

means for electrically disconnecting a selected plurality of sense amplifiers from said array while leaving other sense amplifiers in said array connected, said disconnected sense amplifiers being associated with product terms of said array which have been programmed out by the user; and program means for electrically selecting the sense amplifiers to be disconnected in accordance with the product terms selected to be used in said array.

20. A circuit for controlling the power to plurality of sense amplifiers used for sensing data on data lines in an array of floating gate storage cells, wherein data stored in said array is sensed at regular intervals, comprising:

a plurality of data paths through said array;

a plurality of clock means, each clock means providing an initiation signal which starts the propagation of certain data through said array and through the respective one of said plurality of data paths associated with said clock means;

a delay means for delaying each of said plurality of initiation signals an amount which equals or exceeds the maximum delay in any of said plurality of data paths, each of said delay means producing a completion signal at the end of said delay;

OR-gate means for OR-ing said initiation and said completion signals; and switching means coupled to said sense amplifiers and to said OR-gate means for powering up said sense amplifiers upon receipt of an initiation signal from said OR-gate means and for powering down said sense amplifiers upon receipt of a completion signal from said OR-gate means, whereby the power consumption of said sense amplifiers are reduced because they are powered only during the duration of data transmission, but are otherwise powered down.

21. The circuit of claim 20 further characterized by the addition of a means for electrically disconnecting a selected plurality of sense amplifiers from said array while leaving other sense amplifiers in said array connected, said disconnected sense amplifiers being associated with product terms of said array which have been programmed out by the user; and program means for electrically selecting the sense amplifiers to be disconnected in accordance with the product terms selected to be used in said array.

* * * * *

UNITED STATES PATENT AND TRADEMARK OFFICE
CERTIFICATE OF CORRECTION

PATENT NO. : 4,851,720

DATED : 07/25/89

INVENTOR(S) : Pathak et al.

It is certified that error in the above-identified patent and that said Letters Patent is hereby corrected as shown below:

| | | |
|---|---|---|
| col. 01, line 27 | delete "paint" | insert --point-- |
| col. 02, line 08 | delete "on" | insert --one-- |
| col. 04, line 17 | delete "14" | insert --141-- |
| [75] Inventors | delete "Douglas" | insert --Douglass-- |

Signed and Sealed this

First Day of January, 1991

Attest:

HARRY F. MANBECK, JR.

*Attesting Officer*    *Commissioner of Patents and Trademarks*